Figure 1:
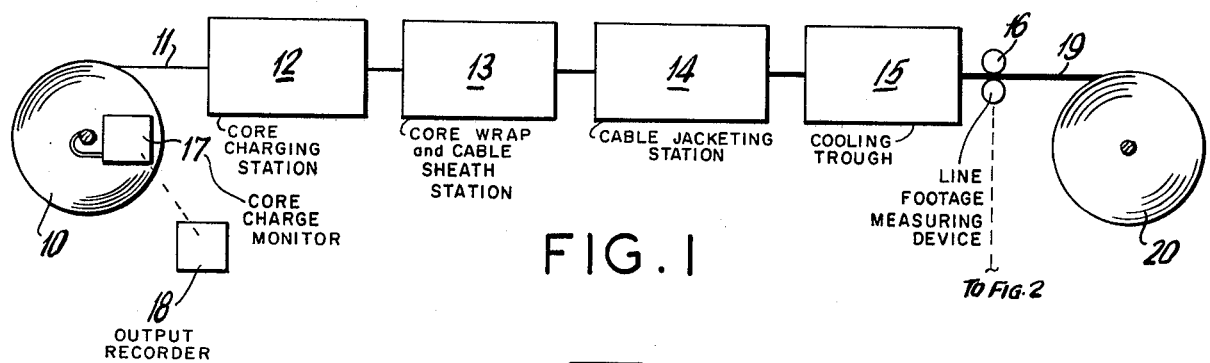

United States Patent [19]

Biskeborn

[11] 4,084,997
[45] Apr. 18, 1978

[54] APPARATUS FOR MONITORING CORE CHARGING OF WATERPROOF COMMUNICATION CABLE

[75] Inventor: Merle C. Biskeborn, Chatham, N.J.

[73] Assignee: Phelps Dodge Industries, Inc., New York, N.Y.

[21] Appl. No.: 712,155

[22] Filed: Aug. 6, 1976

[51] Int. Cl.² ............................................. B05B 1/00
[52] U.S. Cl. ................................... 156/356; 156/378; 324/60 C
[58] Field of Search ............... 324/61 R, 61 P, 60 C, 324/52; 156/356, 378, 60, 64

[56] References Cited

U.S. PATENT DOCUMENTS

| | | | |
|---|---|---|---|
| 2,535,027 | 12/1950 | Anderson | 324/61 R X |
| 2,721,975 | 10/1955 | Wojciechowski | 324/61 R |
| 2,968,180 | 1/1961 | Schafer | 324/61 R X |
| 3,096,478 | 7/1963 | Brown | 324/61 R X |
| 3,221,171 | 11/1965 | Locher | 324/61 R |
| 3,241,061 | 3/1966 | Quittner | 324/61 R |
| 3,387,208 | 6/1968 | Foley | 324/60 C |
| 3,471,780 | 10/1969 | Beddows | 324/61 R |
| 3,973,187 | 8/1976 | Cereijo et al. | 324/61 R |

FOREIGN PATENT DOCUMENTS 670,035   4/1952   United Kingdom .............. 324/61 R

*Primary Examiner*—David A. Simmons
*Attorney, Agent, or Firm*—Davis, Hoxie, Faithfull & Hapgood

[57] ABSTRACT

An apparatus is disclosed for monitoring the charging of a cable core with filling compound by continuously comparing the mutual capacitance of a twisted pair in the core with the predicted capacitance of a twisted pair known to be completely charged with filling compound.

5 Claims, 7 Drawing Figures

APPARATUS FOR MONITORING CORE CHARGING OF WATERPROOF COMMUNICATION CABLE

The basic building block of communication cable is a pair of twisted wires, individually insulated, which carry a single signal. A number of twisted pairs, generally up to 25, are assembled into a group, and groups are in turn assembled into larger and larger components comprising the core of the cable. Although cable cores are wrapped, commonly in polyethylene or other plastic, and the cables are then sheathed and jacketed, it has also been found desirable to charge the space in the core of the cable around the conductors with a waterproofing filling compound. Petroleum jelly, suitably modified to provide the desired melting point, is one such compound currently in use.

Filling compounds are forced into the cable core under pressure on the production line before the cable core is wrapped. Until now, there has been no way to determine contemporaneously whether the core is completely charged, i.e., whether the charging station has forced the compound all the way in to the center of the core so that no empty space exists between the conductors. Present control methods depend on end samples, which do not permit identification of a problem until faulty cable has been manufactured.

The present invention provides a reliable indication of whether the filling compound has permeated the core. It also identifies the longitudinal location along the cable where any imperfectly filled areas are located.

Briefly, the present invention makes use of the increase in the mutual capacitance of a twisted pair that occurs when the wires of a pair are completely surrounded by filling compound. For one typical cable, for example, the increase is from 12.8 pf/ft. to 15.7 pf/ft. (42 pf/m. to 51 pf/m.) or roughly 23%. According to the present invention in its basic embodiment, the mutual capacitance of a centrally located twisted pair is measured and compared with the value predicted for a completely filled cable.

Figure 2:
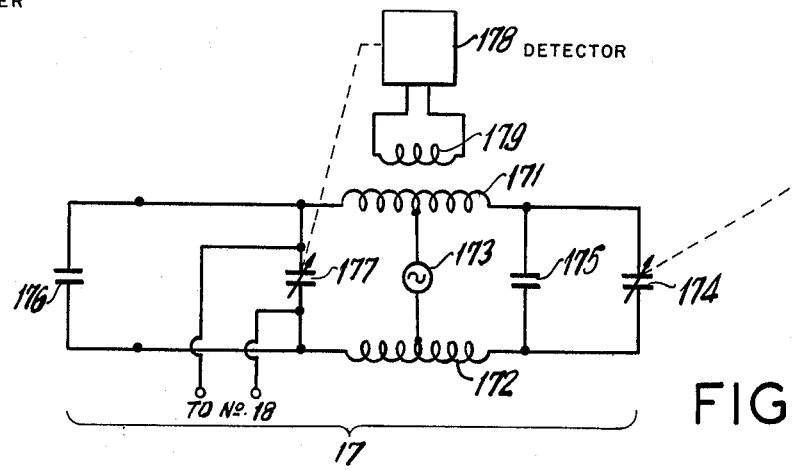
Figure 3:
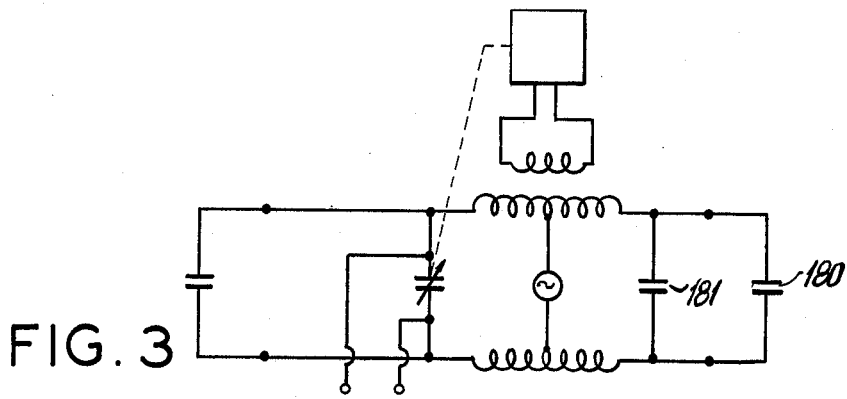
Figure 4:
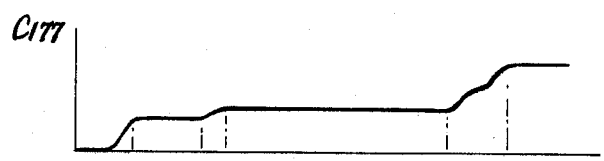
Figure 5:
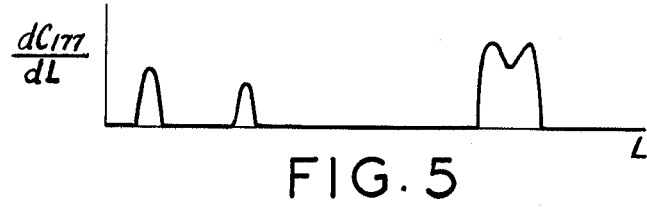

Since the actual and predicted values both depend on the amount of cable that has passed the charging station, the comparison must be constantly adjusted as additional cable passes the station. The manner in which the invention is practiced will become clear from the drawings and accompanying detailed description in which FIG. 1 is a schematic representation of a cable production line having a core charge monitor system, FIG. 2 is a circuit diagram of the core charge monitor system shown in FIG. 1, FIG. 3 is a similar circuit diagram of a second embodiment of a core charge monitoring system, and FIGS. 4 and 5 are graphs showing two possible output records derived from the core charge monitoring system.

Referring to FIG. 1, the cable production line includes a supply reel 10 containing the prepared cable core 11, a core charging station 12 where the filling compound is forced into the cable core under pressure, a station 13 where the core wrap and cable sheath are applied (in practice this could be two separate stations), a jacket station 14 where the outer jacket is extruded onto the cable, a cooling trough 15 through which the freshly jacketed cable runs, a line footage indicator 16 for measuring the length of finished cable 19 and take-up reel 20. The core charge monitoring system 17 of the present invention is mounted on supply reel 10. Charge monitoring system 17 may be connected to an output recording device 18 by slip rings, a voltage-to-frequency radio transmission system or other appropriate means.

Figure 6:
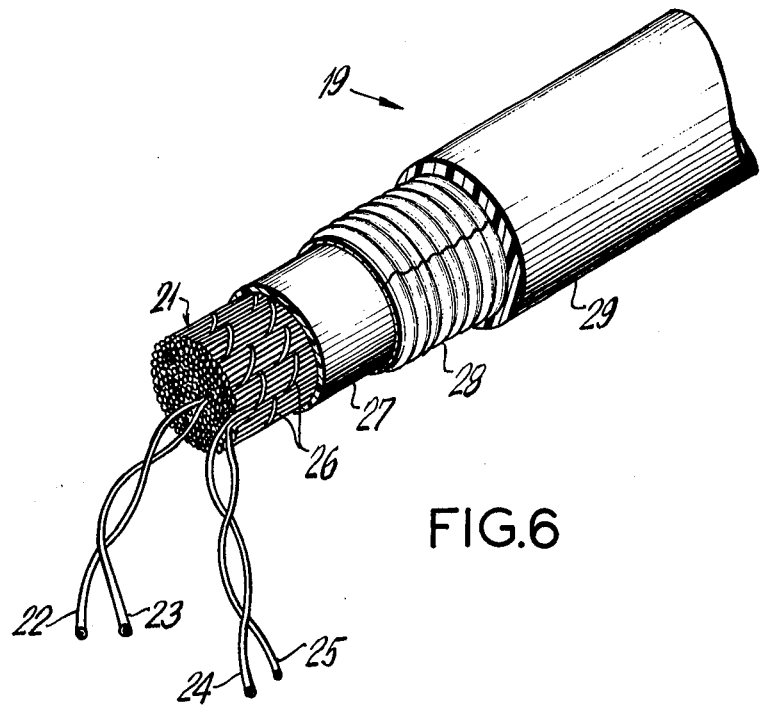
Figure 7:
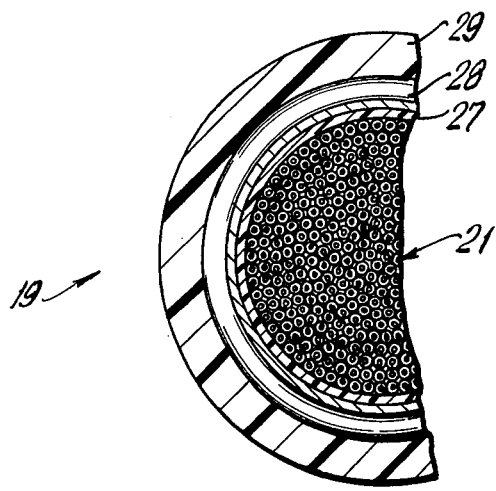

FIGS. 6 and 7 illustrate the components of a conventional fully assembled communication cable 19 of the type referred to herein. Such a cable has a core 21 made up of several groups of twisted pairs, each group being held together by binders such as binders 26, commonly thin ribbons of propylene. As stated above, each group normally contains up to 25 twisted pairs such as pairs 22–23 and 24–25, so that a core including many groups can contain well over one hundred pairs. The assembled and charged core also contains filling compound of the type referred to above, located in the interstices among the conductors in the spaces appearing as voids in the end-on view of FIG. 7. It will be apparent that pair 22–23 is located very near the center of the core and that, by contrast, pair 24–25 is located on its perimeter.

Surrounding core 21 are the further protective components of the cable added at stations 13, 14 and 15 in FIG. 1. Specifically, core wrapping polyester layer 27 and corrugated aluminum shield 28 are applied at the station or stations represented by numeral 13 in FIG. 1, and the outer plastic jacket 29 is applied to the cable at extrusion station 14 and cooling trough 15 schematically illustrated in FIG. 1.

As shown in FIG. 2, the core charge monitor system is based on a balanced hybrid coil bridge. Inductances 171 and 172, symmetrically placed with respect to signal generator 173, form the top and bottom of the bridge. The parallel arrangement of capacitors 174 and 175 forms one arm, and the parallel arrangement of capacitors 176 and 177 forms the other. Capacitor 174 is a continously variable capacitor coupled to the line footage indicator by an appropriate scale factor so that as the core is fed through the machine, the predicted incremental mutual capacitance per unit length attributed to the core charging operation is added to its value. Capacitor 175 is made equal in value to the predetermined mutual capacitance between the wires of the twisted pair being monitored, over the entire length of the cable, in the absence of any filling compound. Capacitor 176 is the actual instantaneous mutual capacitance between the wires of the twisted pair being monitored, a pair such as pair 22–23 shown in FIG. 6 located at or near the center of the core, and capacitor 177 is a balancing capacitor, which is adjusted to whatever value will hold the bridge in balance. Capacitor 177 is driven through suitable means by detector 178 which senses any imbalance in the bridge via inductance 179.

Since the resultant of parallel capacitances is the sum of the individual capacitances, the effective capacitance of the right arm of the bridge is the sum of the end-to-end capacitance of the uncharged twisted pair, capacitance 175, plus the instantaneous predicted incremental capacitance 174, attributed to the length of core charging thus far accomplished, assuming the core charging to be complete. Similarly, the capacitance of the left arm of the bridge is the sum of the instantaneous end-to-end measured capacitance 176 plus a balancing capacitance 177. Before any cable core has passed the core charging station, capacitances 174 and 177 will both be zero, and the bridge will be balanced because the measured capacitance 176 will be the unfilled capacitance 175. As core charging proceeds, the instantaneous measured capacitance 176 will increase as will the capacitance of the right arm of the bridge, the sum of capacitances 174 and 175. As long as the charging is complete, the measured capacitance 176 between the wires 22 and 23 will equal the total capacitance of the right arm of the bridge, and capacitance 177 will remain zero. However, if regions of incomplete charge occur, the measured capacitance 176 will fall below the sum of capacitances 174 and 175, and the bridge will become unbalanced. Th imbalance will cause current to flow in inductance 179, in turn triggering detector 178 and causing it to drive balancing capacitor 177 to whatever value will correct the imbalance. Capacitor 177 therefore will change value whenever another region of core is less than completely charged. Output recording device 18 can be connected to charge monitoring system 17 for displaying the value of capacitor 177 by suitable means as described above.

To avoid local non-uniformities that might otherwise give false indications of incomplete charge, more than one pair may be connected to the bridge shown in FIG. 2. Adjacent pairs are a desirable choice, because imperfect charging affecting one pair should also affect its neighbors. If more than one pair are used in this embodiment, suitable adjustments, within the skill of the art, must be made to average the measured capacitances or to adjust the scale factors of the other capacitances in the bridge.

A second embodiment of a core charge monitoring system is shown in FIG. 3. In this embodiment the measured mutual capacitance 180 of an outer pair such as pair 24-25 located near the perimeter of the core, a pair that will surely be completely charged, is used as the standard against which the center pair capacitance is compared. In other words, a connection to an outer pair is substituted for capacitances 174 and 175 and the former's link to line footage indicator 16. Capacitor 181 is used, if necessary, to bring the bridge into initial balance before the charging operation is begun. Since the outer pair composed of wires 24 and 25 will be completely charged, the capacitance of the right arm of the bridge will increase steadily as the cable is fed through the charging station.

FIG. 4 illustrates the simplest output format for the system of the invention, a plot of the value of capacitance 177 versus the length L of cable that has passed charging station 12. The location along the abscissa of each increase in the capacitance fixes the positions of incomplete charge. The amount of each increase gives a measure of the charging deficiency that exists at each such region.

A more refined output, shown in FIG. 5, is the derivative with respect to length of the value of capacitance 177. Each upward step in the value of capacitance 177 will be represented by a positive spike, as shown in FIG. 5. Since capacitance 177 is the balancing capacitance, its derivative with respect to L will be zero along those segments of the cable that are fully charged with compound. A signal of the type represented in FIG. 5 could conveniently be used as a corrective control signal, for example, to increase the pressure of the charging apparatus whenever the signal departs from its null value.

I claim:

1. Apparatus for continously monitoring the charging with filling compound of a cable core of predetermined total length and comprising a plurality of twisted pairs, the apparatus comprising:

means for continously charging with filling compound successive incremental lengths of cable core passing said charging means;

means connected to one end of a first of the plurality of twisted pairs for continously sensing, as the successive incremental lengths of the core are charged, the mutual capacitance of that first twisted pair; and means associated with the sensing means for continously comparing the sensed mutual capacitance of the first twisted pair with a value representing the mutual capacitance of a twisted pair in the core of a cable of the same total length which has been completely charged with filling compound over a distance equal to the sum of the incremental lengths of cable that have passed the charging means.

2. The apparatus of claim 1 wherein the first twisted pair whose capacitance is continually sensed is centrally located in the cable core.

3. The apparatus of claim 2 wherein the comparing means comprises a bridge
   one arm of which comprises
      a parallel arrangement of a capacitance equal in value to the predetermined mutual capacitance between the wires of the first twisted pair in the absence of any filling compound and a capacitance equal in value to the predicted additional mutual capacitance between the wires of the first twisted pair resulting from the complete core charging of the sum of the incremental lengths of cable that have passed the charging means, and
   the other arm of which comprises
      a parallel arrangement of the sensed mutual capacitance of the first twisted pair and a balancing capacitance.

4. Th apparatus of claim 3 further including:
   line footage indicator means for measuring the sum of the incremental lengths of core that have passed the charging means, and
   scale factor means electrically associated with the line footage indicator means for multiplying the measured sum by a predetermined additional capacitance per unit incremental length attributed to complete core charging to produce the predicted additional mutual capacitance.

5. The apparatus of claim 2 further comprising
   means connected to one end of a second of the plurality of twisted pairs for continously sensing, as the successive incremental lengths of the core are charged, the mutual capacitance of that second twisted pair, the second twisted pair being located near the perimeter of the cable core, and
   wherein the comparing means comprises a bridge one arm of which comprises
      the sensed mutual capacitance of the second twisted pair, and
   the other arm of which comprises
      a parallel arrangement of the sensed mutual capacitance of the first twisted pair and a balancing capacitance.

* * * * *